(12) United States Patent
Kim et al.

(10) Patent No.: US 12,300,649 B2
(45) Date of Patent: May 13, 2025

(54) SEMICONDUCTOR PACKAGE

(71) Applicant: SAMSUNG ELECTRONICS CO., LTD., Suwon-si (KR)

(72) Inventors: Yong Ho Kim, Hwaseong-si (KR); Bo In Noh, Suwon-si (KR); Jeong Hoon Ahn, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 501 days.

(21) Appl. No.: 17/702,259

(22) Filed: Mar. 23, 2022

(65) Prior Publication Data

US 2023/0034654 A1 Feb. 2, 2023

(30) Foreign Application Priority Data

Jul. 28, 2021 (KR) ........................ 10-2021-0098879

(51) Int. Cl.
*H01L 23/00* (2006.01)
*H01L 25/065* (2023.01)
*H01L 25/10* (2006.01)

(52) U.S. Cl.
CPC .............. *H01L 24/08* (2013.01); *H01L 24/05* (2013.01); *H01L 24/06* (2013.01); *H01L 24/09* (2013.01); *H01L 24/13* (2013.01); *H01L 24/16* (2013.01); *H01L 24/17* (2013.01); *H01L 25/0652* (2013.01); *H01L 25/105* (2013.01); *H01L 24/32* (2013.01); *H01L 24/73* (2013.01); *H01L 2224/05124* (2013.01); *H01L 2224/05147* (2013.01); *H01L 2224/05564* (2013.01); *H01L 2224/05582* (2013.01); *H01L 2224/05647* (2013.01); *H01L 2224/05666* (2013.01); *H01L 2224/06505* (2013.01); *H01L 2224/0801* (2013.01); *H01L 2224/08056* (2013.01); *H01L 2224/08059* (2013.01); *H01L 2224/0903* (2013.01); *H01L 2224/09051* (2013.01); *H01L 2224/09132* (2013.01);
(Continued)

(58) Field of Classification Search
CPC ..... H01L 25/0657; H01L 24/11; H01L 24/05; H01L 24/13; H01L 24/16; H01L 2224/81; H01L 2225/06582; H01L 2225/06513; H01L 2225/06585; H01L 2225/06541; H01L 2225/06593
See application file for complete search history.

(56) References Cited

U.S. PATENT DOCUMENTS 8,922,008 B2 * 12/2014 Myung .................. H01L 24/05
257/772
9,209,112 B2 * 12/2015 Imai .................. H01L 21/76898
(Continued)

*Primary Examiner* — Michael M Trinh
(74) *Attorney, Agent, or Firm* — Sughrue Mion, PLLC

(57) ABSTRACT

A semiconductor package is provided. The semiconductor package includes: a first stack including a first semiconductor substrate; a through via that penetrates the first semiconductor substrate in a first direction; a second stack that includes a second face facing a first face of the first stack, on the first stack; a first pad that is in contact with the through via, on the first face of the first stack; a second pad including a concave inner side face that defines an insertion recess, the second pad located on the second face of the second stack; and a bump that connects the first pad and the second pad, wherein the bump includes a first upper bump on the first pad, and a first lower bump between the first upper bump and the first pad.

20 Claims, 27 Drawing Sheets

(52) U.S. Cl.
CPC ........... *H01L 2224/09133* (2013.01); *H01L 2224/09134* (2013.01); *H01L 2224/13147* (2013.01); *H01L 2224/13541* (2013.01); *H01L 2224/13552* (2013.01); *H01L 2224/13564* (2013.01); *H01L 2224/1357* (2013.01); *H01L 2224/13618* (2013.01); *H01L 2224/13624* (2013.01); *H01L 2224/13639* (2013.01); *H01L 2224/13644* (2013.01); *H01L 2224/16013* (2013.01); *H01L 2224/16014* (2013.01); *H01L 2224/16055* (2013.01); *H01L 2224/16058* (2013.01); *H01L 2224/16059* (2013.01); *H01L 2224/16148* (2013.01); *H01L 2224/16227* (2013.01); *H01L 2224/16238* (2013.01); *H01L 2224/1703* (2013.01); *H01L 2224/17055* (2013.01); *H01L 2224/17132* (2013.01); *H01L 2224/17133* (2013.01); *H01L 2224/17136* (2013.01); *H01L 2224/32145* (2013.01); *H01L 2224/32225* (2013.01); *H01L 2224/73204* (2013.01); *H01L 2225/1023* (2013.01); *H01L 2225/1058* (2013.01)

(56) References Cited

U.S. PATENT DOCUMENTS

| | | | |
|---|---|---|---|
| 9,627,347 B2 * | 4/2017 | Aoyagi | H01L 24/11 |
| 9,837,383 B2 | 12/2017 | Gandhi et al. | |
| 9,984,993 B2 | 5/2018 | Shu et al. | |
| 10,340,249 B1 | 7/2019 | Yu et al. | |
| 10,529,664 B2 * | 1/2020 | Lu | H01L 24/11 |
| 2014/0175614 A1 | 6/2014 | Wang et al. | |
| 2016/0240503 A1 * | 8/2016 | Shu | H01L 21/563 |
| 2020/0051939 A1 | 2/2020 | Dadvand et al. | |
| 2020/0266165 A1 | 8/2020 | Pokhrel et al. | |
| 2021/0074662 A1 | 3/2021 | Moitzi et al. | |
| 2021/0407949 A1 * | 12/2021 | Park | H01L 23/481 |

* cited by examiner

SEMICONDUCTOR PACKAGE

CROSS-REFERENCE TO THE RELATED APPLICATION

This application claims priority from Korean Patent Application No. 10-2021-0098879, filed on Jul. 28, 2021 in the Korean Intellectual Property Office, and all the benefits accruing therefrom under 35 U.S.C. 119, the entire contents of which are herein incorporated by reference.

BACKGROUND

1. Field

Embodiments of the present disclosure relate to a semiconductor package.

2. Description of the Related Art

In accordance with the rapid development of the electronic industry and demands of users, electronic devices are becoming smaller and lighter, and semiconductor packages used in the electronic devices require a high performance and a large capacity along with miniaturization and weight reduction. In order to realize the high performance and the large capacity along with the miniaturization and the weight reduction, research and development of a semiconductor chip including a Through Silicon Via (TSV) structure and a semiconductor package including the semiconductor chip are consistently being conducted.

In particular, contact stability of a bump and a pad is required to reduce the size and weight of the semiconductor package.

SUMMARY

Aspects of the present disclosure provide a semiconductor package in which stability is improved and electrical characteristics are improved.

According to embodiments, a semiconductor package is provided. The semiconductor package includes: a first stack including a first semiconductor substrate; a through via that penetrates the first semiconductor substrate in a first direction; a second stack that includes a second face facing a first face of the first stack, on the first stack; a first pad that is in contact with the through via, on the first face of the first stack; a second pad including a concave inner side face that defines an insertion recess, the second pad located on the second face of the second stack; and a bump that connects the first pad and the second pad, wherein the bump includes a first upper bump on the first pad, and a first lower bump between the first upper bump and the first pad, wherein the first upper bump includes a material different from a material of the first lower bump, and wherein the first upper bump fills at least a part of the insertion recess and is not located on a side wall of the first lower bump.

According to embodiments, a semiconductor package is provided. The semiconductor package includes: a first semiconductor chip including a first semiconductor substrate, and a first semiconductor device layer on a lower face of the first semiconductor substrate; a second semiconductor chip including a second semiconductor substrate, and a second semiconductor device layer on a lower face of the second semiconductor substrate, the second semiconductor chip located on the first semiconductor chip; a first through via that penetrates the first semiconductor substrate in a first direction; a first pad that is in contact with the first through via, on an upper face of the first semiconductor substrate; a second pad that includes a inner side face that is concave and defines an insertion recess, the second pad located on the lower face of the second semiconductor device layer; and a bump that connects the first pad and the second pad, wherein the bump includes an upper bump on the first pad, and a lower bump between the upper bump and the first pad, wherein the upper bump includes a material different from a material of the lower bump, and wherein the upper bump fills at least a part of the insertion recess and is not located on a side wall of the lower bump.

According to embodiments, a semiconductor package is provided. The semiconductor package includes: a first stack including a first semiconductor substrate; a through via that penetrates the first semiconductor substrate in a first direction; a second stack that includes a second face facing a first face of the first stack, on the first stack; a first pad that is in contact with the through via, on the first face of the first stack; a second pad including a concave inner side face that defines an insertion recess, the second pad located on the second face of the second stack; a bump that connects the first pad and the second pad; and a seed layer between the first pad and the bump, wherein the bump includes a first upper bump on the first pad, and a first lower bump between the first upper bump and the first pad, and is placed along an upper face of the seed layer, wherein the seed layer includes a first seed layer between the first pad and the first upper bump, and a second seed layer between the first seed layer and the first upper bump, wherein the first seed layer includes titanium, wherein the second seed layer includes copper, wherein the first pad includes at least one from among aluminum and copper, wherein the second pad includes copper, wherein the first upper bump does not include tin, and includes at least one from among zinc, aluminum, gold and silver, wherein the first lower bump includes copper, wherein an inner side face of the second pad includes an upper face that that faces in a same direction as a facing direction of the second face of the second stack, and the inner side face further includes a first side wall and a second side wall that face each other, the first side wall of the inner side face and the second side wall of the inner side face extending in the first direction, wherein a depth of the second pad in the first direction is smaller than a height of the bump in the first direction, and wherein the first upper bump fills at least a part of the insertion recess, and is not located on a side wall of the first lower bump.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

DETAILED DESCRIPTION OF THE EMBODIMENTS

Figure 1:
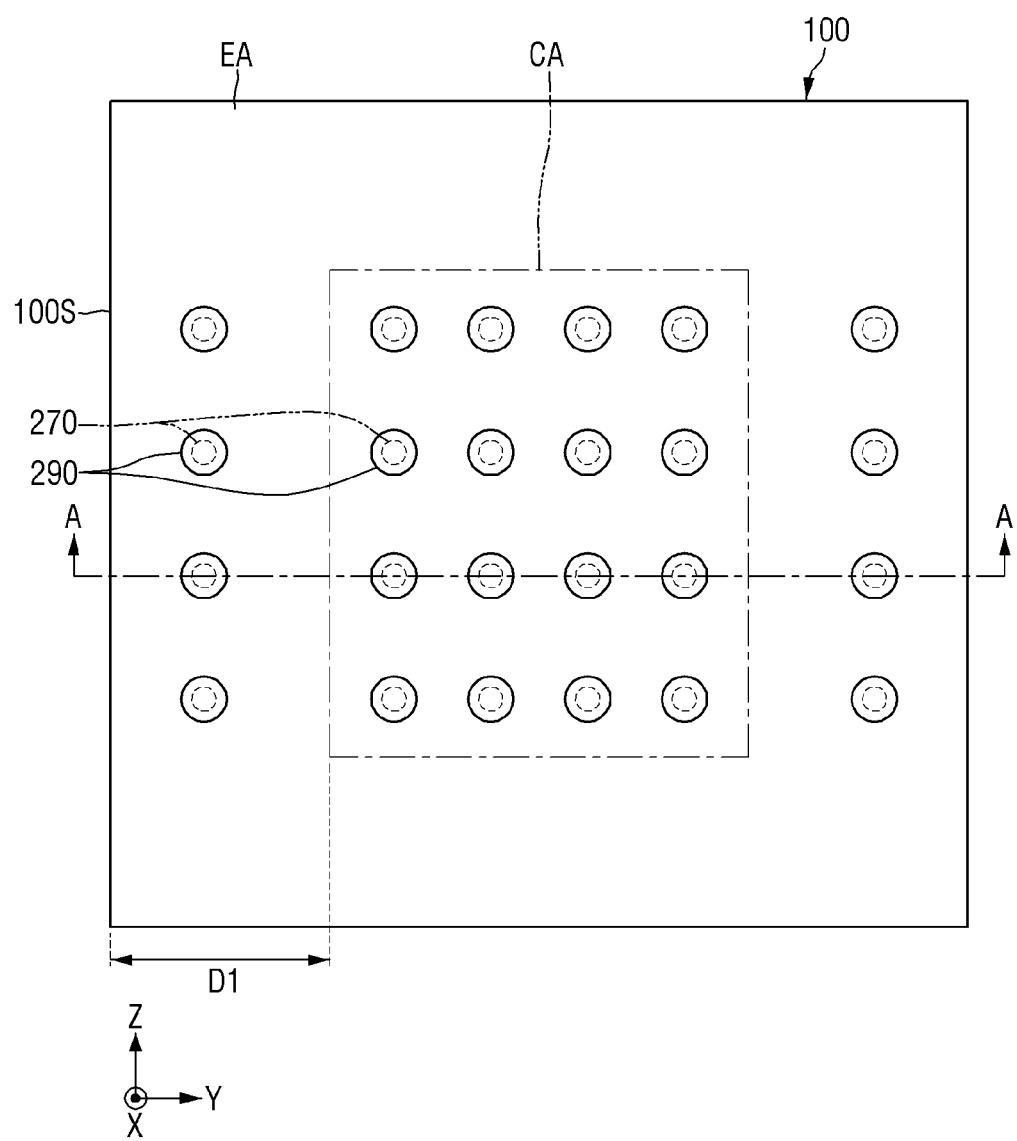
FIG. 1 is an example layout diagram for explaining a semiconductor package according to some embodiments.

Hereinafter, non-limiting example embodiments of the present disclosure will be described in detail referring to the accompanying drawings. Same components on the drawings are denoted by the same reference numerals, and repeated description thereof will not be provided.

Hereinafter, a semiconductor package according to some embodiments will be described referring to FIGS. 1 to 5.

Figure 2:
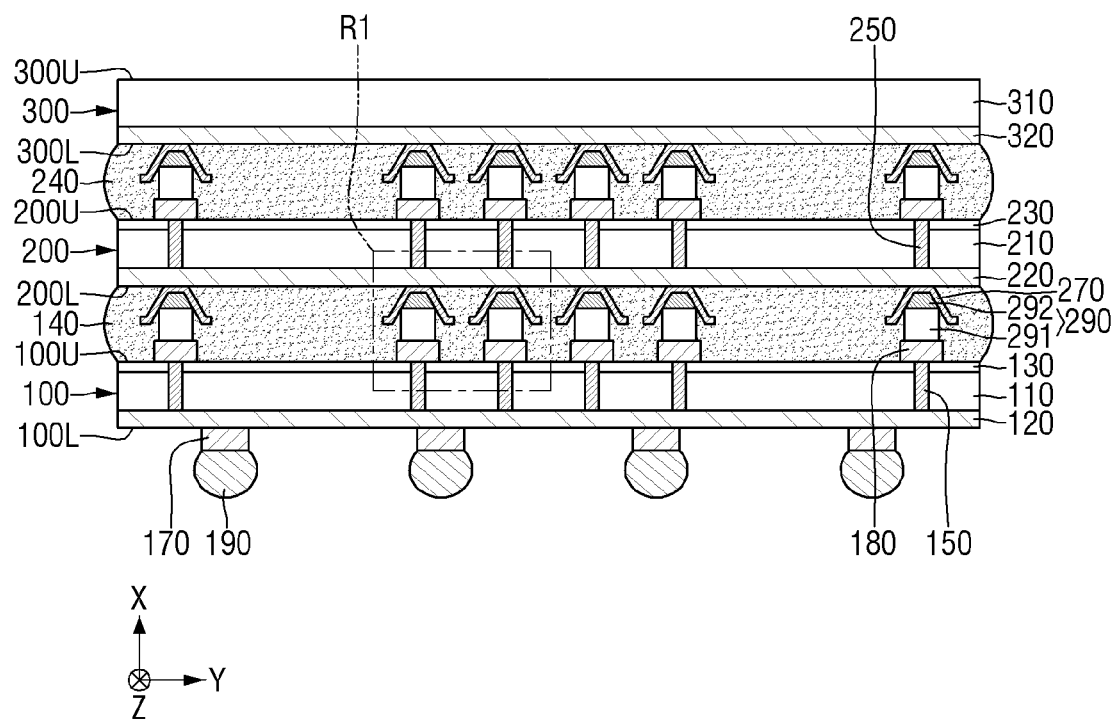
FIG. 2 is a cross-sectional view taken along a line A-A of FIG. 1.
Figure 3:
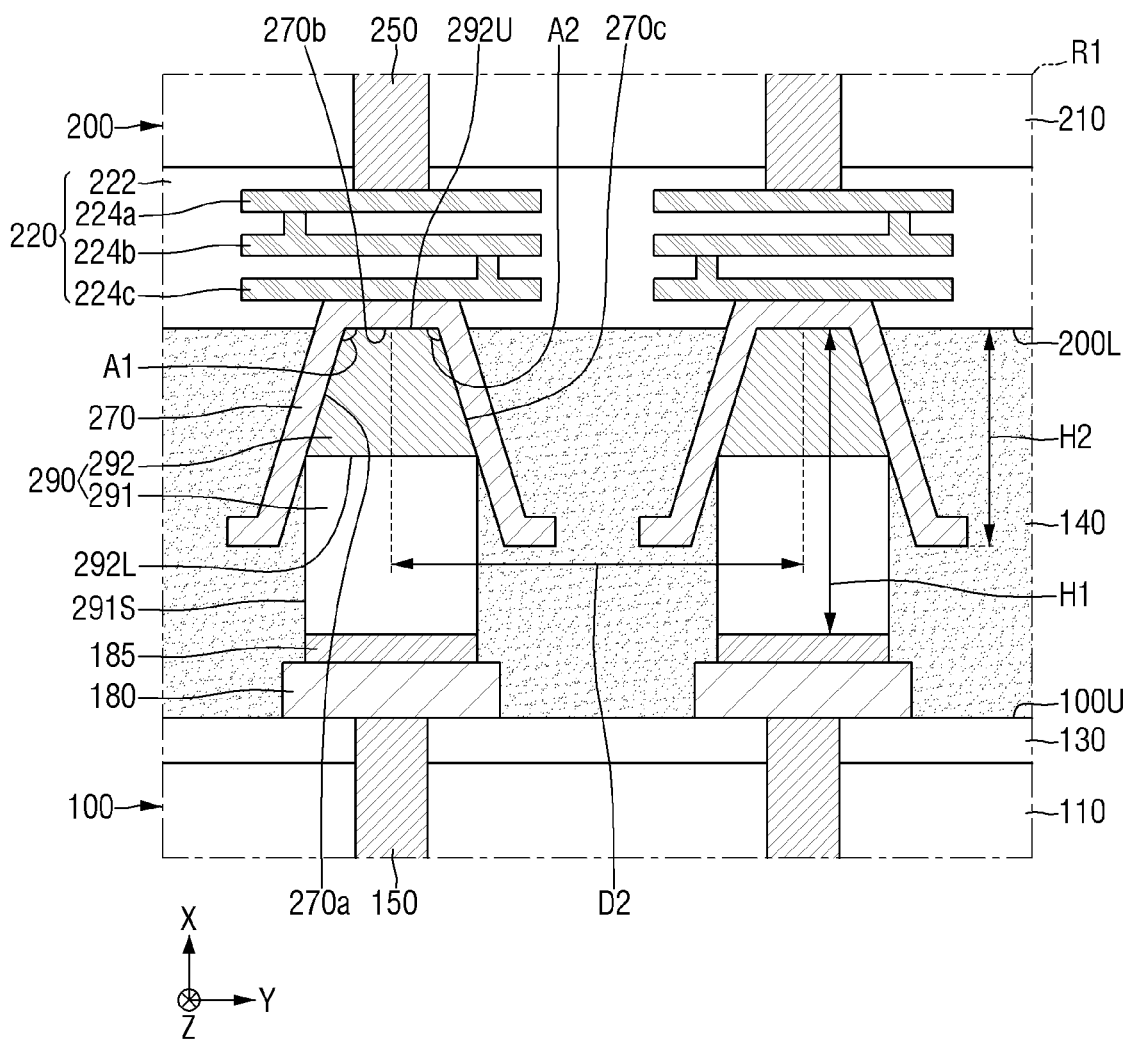
FIG. 3 is a first enlarged view for explaining a region R1 of FIG. 2, according to an embodiment.
Figure 4:
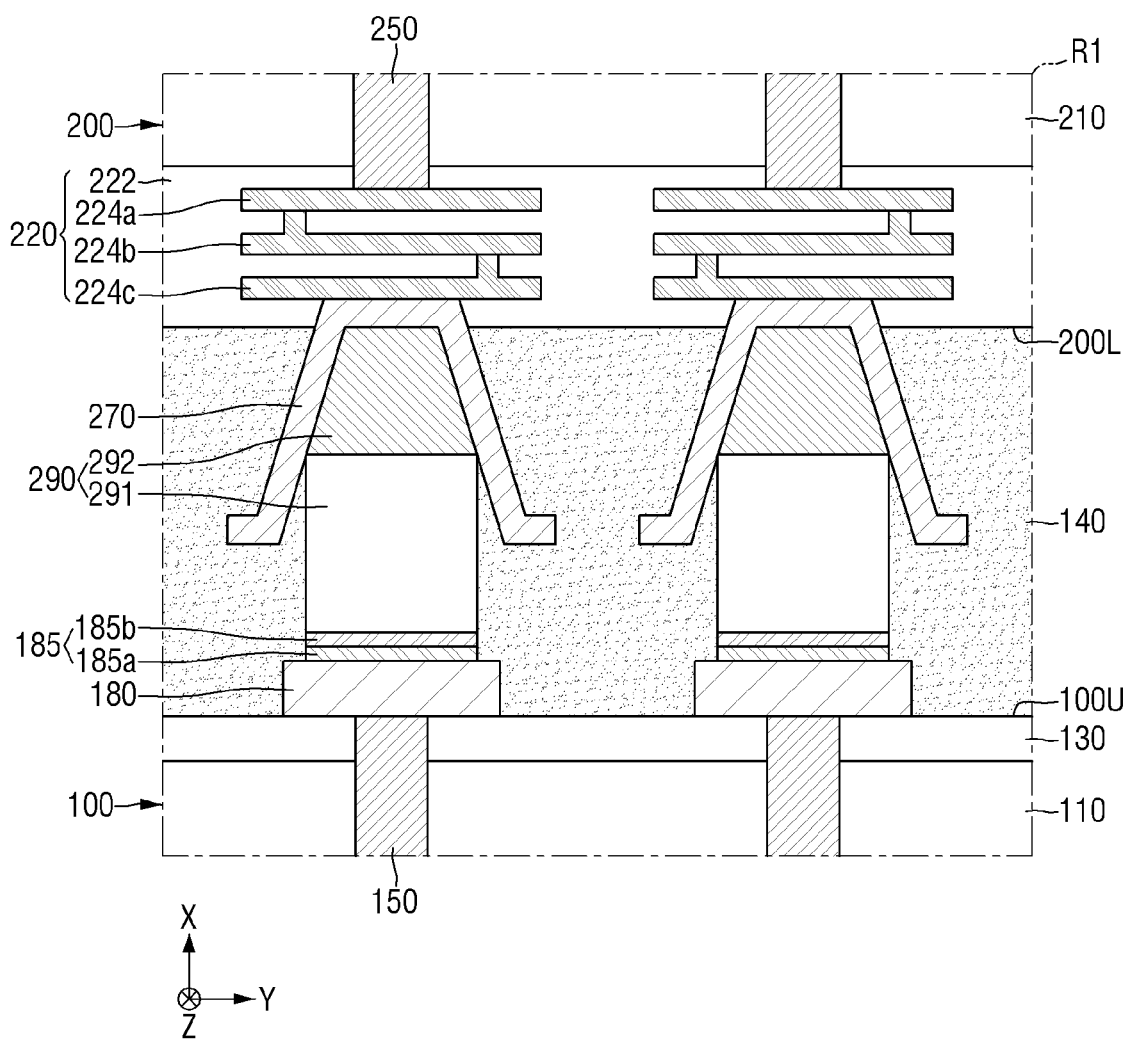
FIG. 4 is a second enlarged view for explaining the region R1 of FIG. 2, according to an embodiment.
Figure 5:
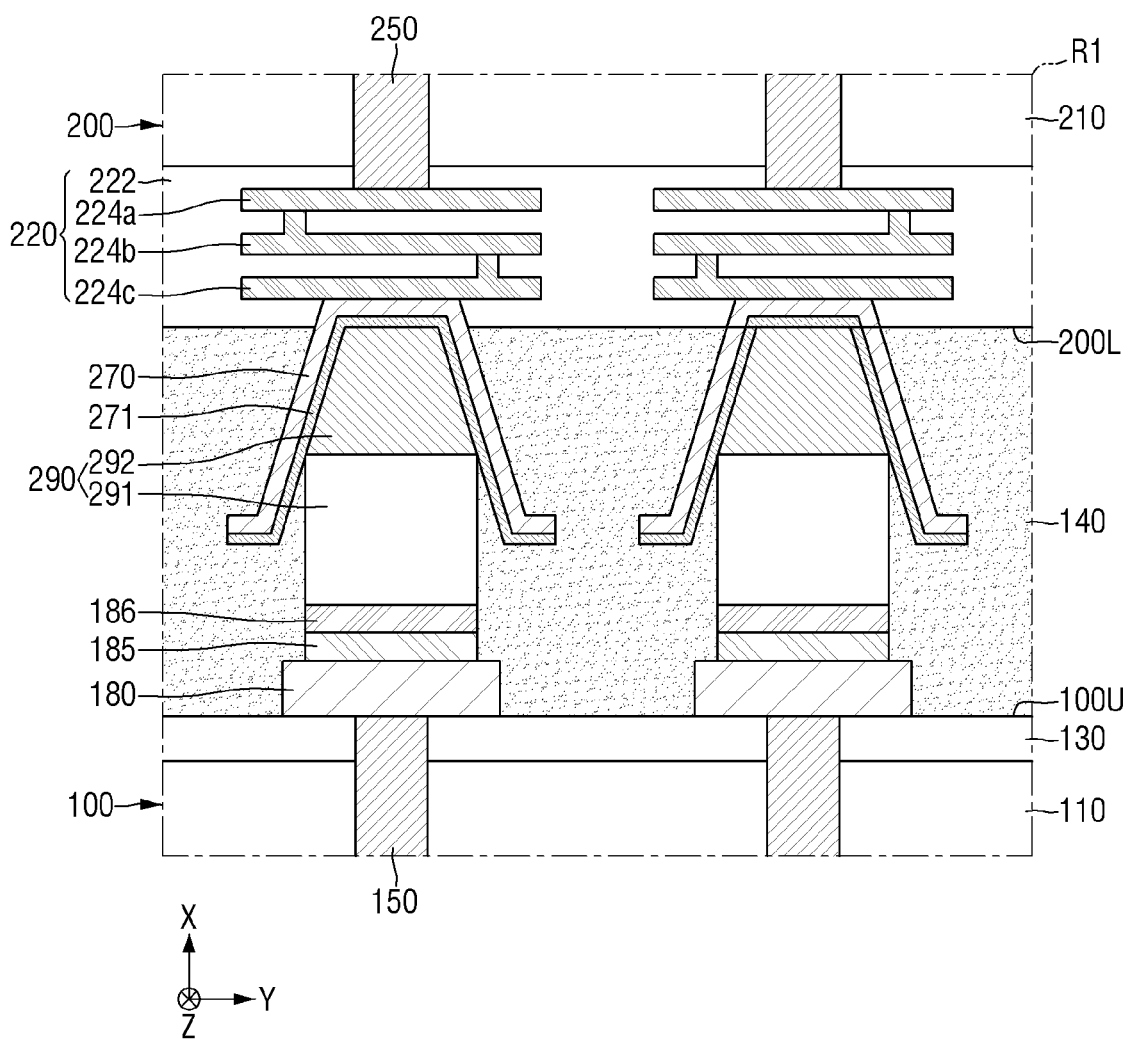
FIG. 5 is a third enlarged view for explaining the region R1 of FIG. 2, according to an embodiment.

FIG. 1 is an example layout diagram for explaining a semiconductor package according to some embodiments. FIG. 2 is a cross-sectional view taken along a line A-A of FIG. 1. FIGS. 3 to 5 are various enlarged views for explaining a region R1 of FIG. 2.

Referring to FIGS. 1 to 5, the semiconductor package according to some embodiments includes a first stack 100, a second stack 200, a plurality of first through vias 150, a first pad 180, a second pad 270, and a first bump 290.

The first stack 100 may include a center region CA and an edge region EA. For example, as shown in FIG. 1, the edge region EA may be placed around the center region CA to form edges of the first stack 100. For example, the first stack 100 may include an edge face 100S extending in a third direction Z. The edge region EA may be defined as a region that extends from the edge face 100S to a position spaced apart from the edge face 100S by a predetermined distance along a second direction Y intersecting the third direction Z. In some embodiments, the distance D1 may be about 200 m or less.

The first stack 100 may include a first face 100L and a second face 100U that are opposite to each other. For example, as shown in FIG. 2, the first face 100L may be a lower face of the first stack 100, and the second face 100U may be an upper face of the first stack 100.

The second stack 200 may be stacked on the first stack 100. The second stack 200 may include a third face 200L and a fourth face 200U that are opposite to each other. The third face 200L of the second stack 200 may be aligned with the first face 100L of the first stack 100. For example, the third face 200L may be a lower face of the second stack 200, and the fourth face 200U may be an upper face of the second stack 200.

The second face 100U may face the third face 200L.

The first stack 100 and the second stack 200 may each be substrates that form a semiconductor package. For example, the first stack 100 and the second stack 200 may each be a semiconductor chip including the semiconductor devices.

In some embodiments, a third stack 300 may be formed on the second stack 200. The third stack 300 may include a fifth face 300L and a sixth face 300U that are opposite to each other. The fifth face 300L of the third stack 300 may face the fourth face 200U of the second stack 200. For example, the fifth face 300L may be a lower face of the third stack 300, and the sixth face 300U may be an upper face of the third stack 300.

In some embodiments, the first stack 100 may include a first semiconductor substrate 110 and a first semiconductor device layer 120, and the second stack 200 may include a second semiconductor substrate 210 and a second semiconductor device layer 220.

The first semiconductor substrate 110 and the second semiconductor substrate 210 may be, for example, bulk silicon or silicon on insulator (SOI), respectively. In contrast, the first semiconductor substrate 110 and the second semiconductor substrate 210 may each be silicon substrate or may include, but are not limited to, other materials, for example, silicon germanium, silicon germanium on insulator (SGOI), indium antimonide, lead tellurium compounds, indium arsenide, indium phosphate, gallium arsenide, or gallium antimonide.

The first semiconductor device layer 120 may be formed on the first semiconductor substrate 110, and the second semiconductor device layer 220 may be formed on the second semiconductor substrate 210. For example, the first semiconductor device layer 120 may be placed on the lower face of the first semiconductor substrate 110, and the second semiconductor device layer 220 may be placed on the lower face of the second semiconductor substrate 210. In some embodiments, the lower face of the first semiconductor device layer 120 may form the first face 100L of the first stack 100, and the lower face of the second semiconductor device layer 220 may form the third face 200L of the second stack 200.

The first semiconductor device layer 120 and the second semiconductor device layer 220 may each include a plurality of individual devices of various types and an inter-wiring insulating film. The individual devices include various microelectronic devices, for example, a MOSFET (metal-oxide-semiconductor field effect transformer) such as a CMOS transistor (complementary metal-insulator-semiconductor transistor, image sensors such as a system LSI (large scale integration), a flash memory, a DRAM, a SRAM, an EEPROM, a PRAM, a MRAM, a RRAM, and a CIS (CMOS imaging sensor), a MEMS (micro-electro-mechanical system), an active element, a passive element, and the like.

In some embodiments, a first protective layer 130 may be formed on the first semiconductor substrate 110, and a second protective layer 230 may be formed on the second semiconductor substrate 210. For example, the second semiconductor substrate 210 may be placed on the upper face of the first semiconductor substrate 110, and the second protective layer 230 may be placed on the upper face of the second semiconductor substrate 210. In some embodiments, an upper face of the first protective layer 130 may constitute the second face 100U of the first stack 100, and an upper face of the second protective layer 230 may form the fourth face 200U of the second stack 200.

The first protective layer 130 and the second protective layer 230 may each include a nonconductive film (NCF). For example, the first protective layer 130 and the second protective layer 230 may each include, but are not limited to, an insulating polymer. The first protective layer 130 and the second protective layer 230 may be formed by, for example, but are not limited to, a spin coating process or a spray process.

In some embodiments, a base pad 170 and a base bump 190 may be formed on the first face 100L of the first stack 100. A plurality of the base pad 170 may be formed on the first face 100L of the first stack 100. Each base pad 170 may be electrically connected to the first semiconductor device layer 120. The base bump 190 may be connected to the base pad 170. The base bump 190 may have various shapes such as a pillar structure, a ball structure, or a solder layer.

A plurality of first through vias 150 may penetrate the first semiconductor substrate 110. For example, each of the first through vias 150 penetrate the first semiconductor substrate 110 and the first protective layer 130, and may be exposed from the second face 100U of the first stack 100. Each of the first through vias 150 may have a columnar shape extending in a direction intersecting the first face 100L and the second face 100U.

The plurality of second through vias 250 may penetrate the second semiconductor substrate 210. For example, each of the second through vias 250 penetrate the second semiconductor substrate 210 and the second protective layer 230, and may be exposed from the fourth face 200U of the second stack 200. Each of the second through vias 250 may have a columnar shape extending in a direction intersecting the third face 200L and the fourth face 200U.

In some embodiments, the first through vias 150 penetrate the first semiconductor substrate 110 and may be connected to the first semiconductor device layer 120, and the second through vias 250 penetrate the second semiconductor substrate 210 and may be connected to the second semiconductor device layer 220. For example, as shown in FIG. 3, the second semiconductor device layer 220 may include a first inter-wiring insulating film 222, and first wirings 224a, 224b and 224c inside the first inter-wiring insulating film 222. The first wirings 224a, 224b and 224c may be stacked sequentially from the lower face of the second semiconductor substrate 210. The second through vias 250 may be electrically connected to the second semiconductor device layer 220 by the first wirings 224a, 224b and 224c.

In some embodiments, the second through vias 250 may come into contact with a highest wiring (e.g. first wiring 224a) among the first wirings 224a, 224b and 224c. The highest wiring (e.g. first wiring 224a) of the second semiconductor device layer 220 may be a wiring that is closest to the second semiconductor substrate 210 among the first wirings 224a, 224b and 224c.

In some embodiments, the first through vias 150 and the second through vias 250 may each include a barrier film formed on a columnar surface, and a buried conductive layer that fills the interior of the barrier film. The barrier film may include, but is not limited to, at least one of Ti, TiN, Ta, TaN, Ru, Co, Mn, WN, Ni, and NiB. The buried conductive layer may include, but is not limited to, at least one of Cu alloys such as Cu, CuSn, CuMg, CuNi, CuZn, CuPd, CuAu, CuRe and CuW, W, W alloys, Ni, Ru, and Co.

Although not shown, in some embodiments, an insulating film may be interposed between the first semiconductor substrate 110 and the first through vias 150, and between the second semiconductor substrate 210 and the second through vias 250. The insulating film may include, but is not limited to, an oxide film, a nitride film, a carbonized film, a polymer, or a combination thereof.

A plurality of the first pad 180 may be formed on the second face 100U of the first stack 100. Each first pad 180 may come into contact with at least one of the plurality of first through vias 150. For example, the first pad 180 is formed on the first semiconductor substrate 110 and may come into contact with one of the first through vias 150 exposed by the first semiconductor substrate 110.

The first pad 180 may include at least one of aluminum and copper.

A plurality of the second pad 270 may be formed on the third face 200L of the second stack 200. Each second pad 270 may be electrically connected to the second semiconductor device layer 220. For example, the second pad 270 may be electrically connected to the individual devices of the second semiconductor device layer 220 or one of the second through vias 250.

The second pad 270 may include concave inner side faces (e.g. a first side wall 270a, an upper face 270b, and a second side wall 270c). For example, the second pad 270 may have a cup shape. The second pad 270 may include an insertion recess (R of FIG. 8) defined by concave inner side faces.

The inner side faces of the second pad 270 may include an upper face 270b, a first side wall 270a, and a second side wall 270c. The upper face 270b of the inner side face of the second pad may be aligned (e.g. face in a same direction) with the third face 200L of the second stack 200. The first side wall 270a and the second side wall 270c of the inner side face of the second pad 270 may face each other.

The first side wall 270a and the second side wall 270c of the second pad 270 may extend in the first direction X. An angle formed by the first side wall 270a and the upper face 270b of the second pad 270 may be a first angle A1. The first angle A1 may be greater than 90°. However, the angle formed by the first side wall 270a and the upper face 270b of the second pad is merely an example, and embodiments of the present disclosure are not limited thereto. For example, the first angle A1 may be 90°.

An angle formed by the second side wall 270c and the upper face 270b of the second pad may be a second angle A2. The second angle A2 may be the same as the first angle A1. The second angle A2 may be greater than 90°. However, the angle formed by the second side wall 270c and the upper face 270b of the second pad is merely an example, and embodiments of the present disclosure are not limited thereto. For example, the second angle A2 may be about 90°.

The second pad 270 may include, for example, but not limited to, at least one of aluminum (Al), copper (Cu), nickel (Ni), tungsten (W), platinum (Pt), gold (Au), and a combination thereof.

The first bump 290 may be interposed between the first pad 180 and the second pad 270. The first bump 290 may have, for example, a pillar structure.

The first bump 290 may electrically connect the first pad 180 and the second pad 270. Accordingly, the first stack 100 and the second stack 200 may be electrically connected. For example, the first semiconductor device layer 120 may be electrically connected to the second semiconductor device layer 220 or one of the second through vias 250 through one of the first through vias 150, the first pad 180, the first bump 290, and the second pad 270.

The first bump 290 may connect the first pad 180 and the second pad 270. The first bump 290 may include a first upper bump 292 and a first lower bump 291.

The first upper bump 292 may be placed on the first pad 180. The first upper bump 292 may be placed on the upper face of the first lower bump 291.

The first upper bump 292 may have a truncated cone shape. For example, the first upper bump 292 may include an upper face 292U and a lower face 292L that are opposite to each other. The upper face 292U of the first upper bump 292 may come into contact with the second pad 270. The lower face 292L of the first upper bump 292 may come into contact with the first lower bump 291. A diameter of the upper face 292U of the first upper bump 292 may be smaller than a diameter of the lower face 292L of the first upper bump 292.

Figure 8:
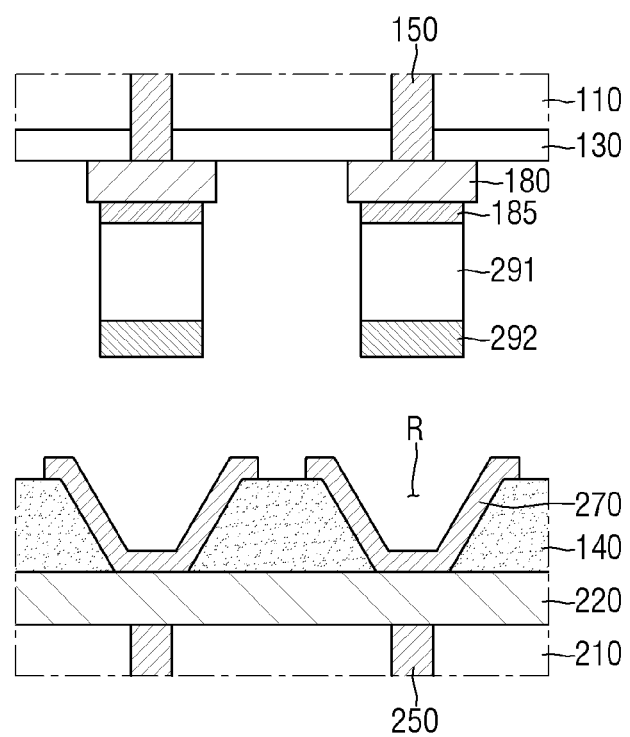
FIG. 8 is a first intermediate stage diagram for explaining a method of fabricating a semiconductor package according to an embodiment.

The first upper bump 292 may fill at least a part of the insertion recess (R of FIG. 8). The first upper bump 292 may not be placed on the side wall 291S of the first lower bump 291.

The first upper bump 292 may not include tin (Sn). The first upper bump 292 may include a metal having a melting point of 400° C. or higher. Young's modulus of the metals included in the first upper bump 292 may be lower than Young's modulus of copper (Cu). For example, the first upper bump 292 may include at least one of zinc (Zn), aluminum (Al), gold (Au), and silver (Ag).

The first lower bump 291 may be placed between the first upper bump 292 and the first pad 180. The first lower bump 291 may be placed on the upper face of the first pad 180. The first lower bump 291 may be placed on a seed layer 185, which will be described later.

The first lower bump 291 may come into contact with the first side wall 270a and the second side wall 270c of the inner side face of the second pad 270.

The first lower bump 291 may include copper (Cu). That is, the first upper bump 292 may include a material different from that of the first lower bump 291.

In a semiconductor package according to some embodiments, the first lower bump 291 may include the same material as the second pad 270. That is, the second pad 270 may be a copper pad including copper.

A height of the first bump 290 in the first direction X may be a first length H1. A depth of the second pad 270 in the first direction X may be a second length H2. The second length H2 may be smaller than the first length H1.

In the semiconductor package according to some embodiments, a plurality of the first bump 290 may be placed between the first stack 100 and the second stack 200.

The plurality of the first bump 290 may be spaced apart from each other in the second direction Y. The distance D2 from a center of one of the plurality of the first bump 290 to the center of an adjacent one of the plurality of the first bump 290 may be smaller than 20 μm.

Referring to FIGS. 3 to 5, the semiconductor package according to some embodiments may further include a seed layer 185. Further, in FIG. 5, the semiconductor package according to some embodiments may further include a first under bump metal layer 186 and a second under bump metal layer 271.

The seed layer 185 may be placed between the first pad 180 and the first bump 290. Specifically, the seed layer 185 may be placed between the first pad 180 and the first lower bump 291. The seed layer 185 may extend along the upper face of the first pad 180.

The first bump 290 may be placed along the upper face of the seed layer 185. The first bump 290 may be placed on the upper face of the seed layer 185.

The seed layer 185 may include a first seed layer 185a and a second seed layer 185b. The first seed layer 185a and the second seed layer 185b may be sequentially stacked on the first pad 180. That is, the first seed layer 185a may be placed between the first pad 180 and the second seed layer 185b.

The first seed layer 185a may be a layer for preventing diffusion between metals. Although the first seed layer 185a may include titanium (Ti), embodiments of the present disclosure are not limited thereto.

The second seed layer 185b may be a seed layer for depositing the first lower bump 291. Although the second seed layer 185b may include copper, embodiments of the present disclosure are not limited thereto.

The first seed layer 185a may have a thickness of about 0.1 m, and the second seed layer 185b may have a thickness of about 0.3 m. However, the thicknesses of the first seed layer 185a and the second seed layer 185b are merely examples, and embodiments of the present disclosure are not limited thereto.

The first under bump metal layer 186 may be placed between the first pad 180 and the first lower bump 291. As shown in FIG. 5, the first under bump metal layer 186 may extend along the upper face of the seed layer 185. The first under bump metal layer 186 may improve the adhesive force between the first pad 180 and the first lower bump 291.

The second under bump metal layer 271 may extend along the inner side face of the second pad 270. The second under bump metal layer 271 may be placed between the second pad 270 and the first upper bump 292. The second under bump metal layer 271 may improve the adhesive force between the second pad 270 and the first upper bump 292.

However, the presence or absence of the first under bump metal layer 186 and the second under bump metal layer 271 is merely an example, and embodiments of the present disclosure are not limited thereto. For example, one of the first under bump metal layer 186 and the second under bump metal layer 271 may not be formed.

In some embodiments, the third stack 300 may include a third semiconductor substrate 310 and a third semiconductor device layer 320. Because the third semiconductor substrate 310 may be similar to the first semiconductor substrate 110 or the second semiconductor substrate 210 described above, and the third semiconductor device layer 320 may be similar to the first semiconductor device layer 120 or the second semiconductor device layer 220, detailed description thereof will not be provided below.

The first stack 100, the second stack 200, and the third stack 300 to be stacked may form, for example, but are not limited to, a multi-chip semiconductor package such as a high bandwidth memory (HBM).

Figure 6:
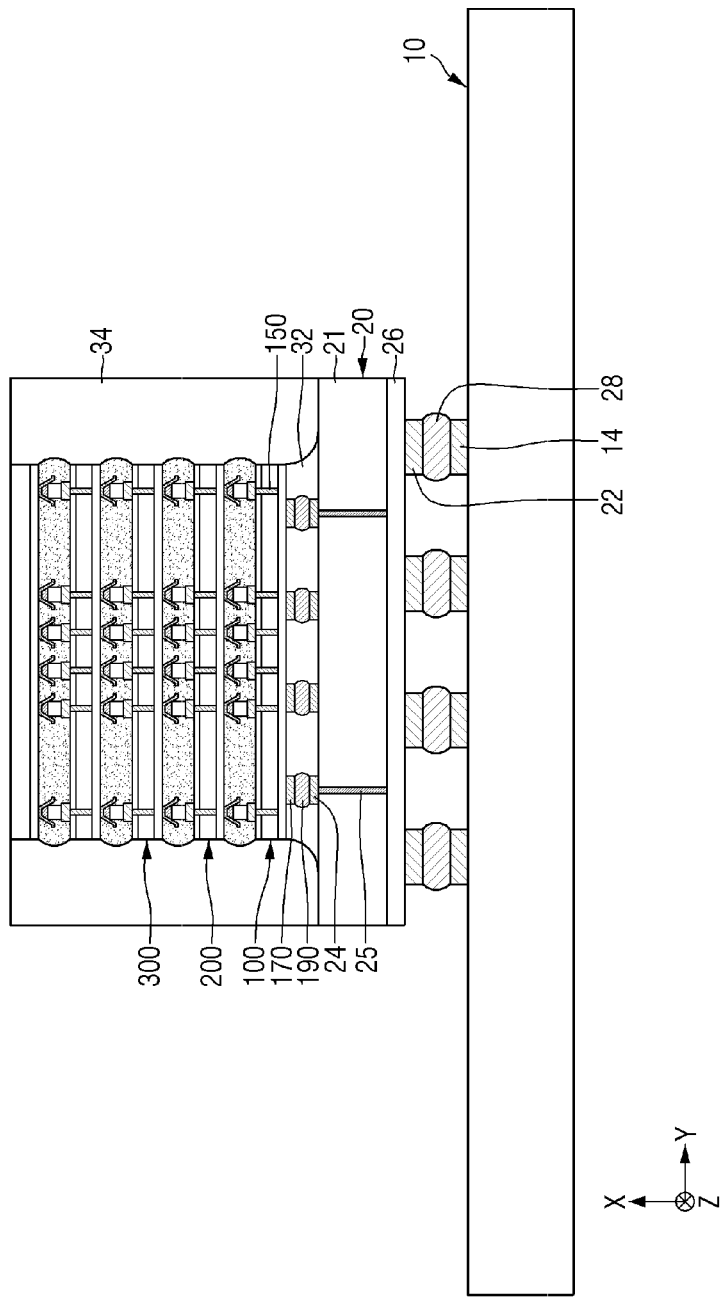
FIG. 6 is a cross-sectional view for explaining a semiconductor package according to an embodiment.
Figure 7:
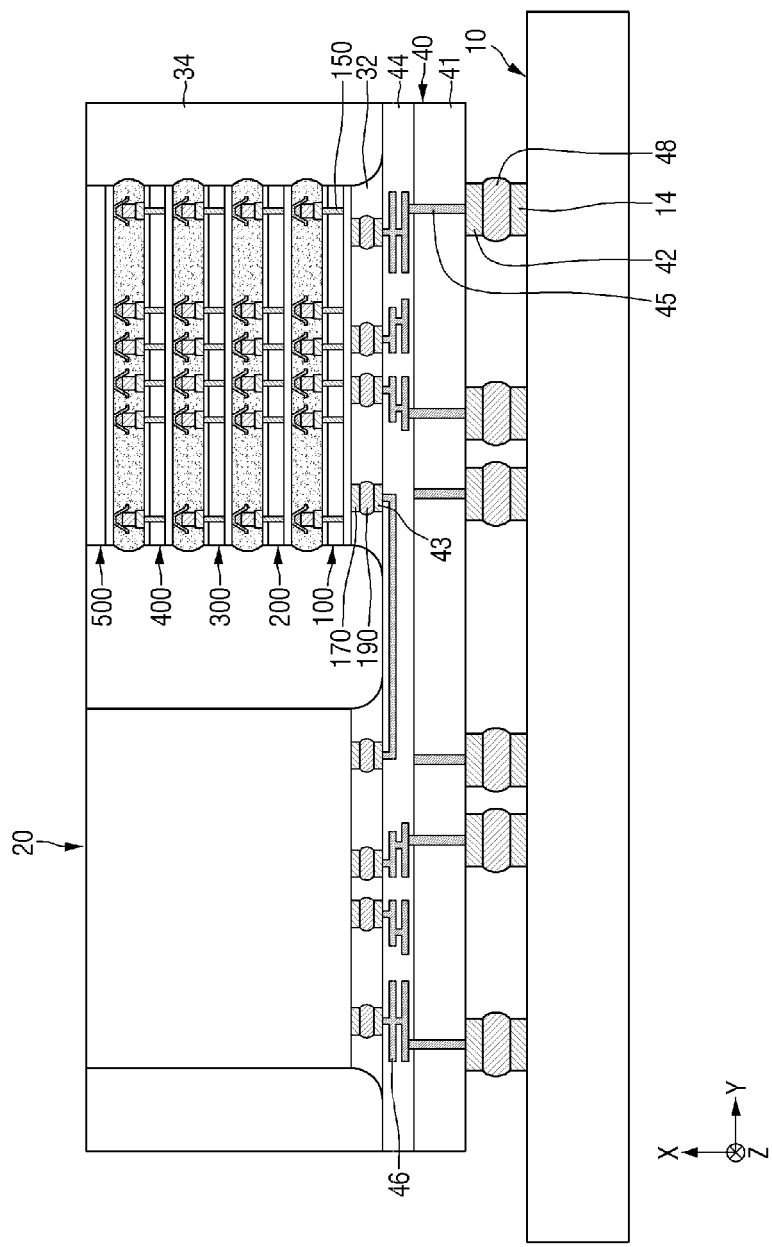
FIG. 7 is a cross-sectional view for explaining a semiconductor package according to an embodiment.

FIGS. 6 and 7 are various cross-sectional views for explaining a semiconductor package according to some embodiments.

Referring to FIG. 6, the semiconductor package according to some embodiments further includes a substrate 10 and a semiconductor chip 20.

The substrate 10 may be a packaging substrate. For example, the substrate 10 may be a printed circuit board (PCB), a ceramic substrate, or the like. Alternatively, the substrate 10 may be a substrate for a wafer level package (WLP) fabricated at a wafer level. The substrate 10 may include a lower face and an upper face that are opposite to each other.

The semiconductor chip 20 may be placed on the substrate 10. The semiconductor chip 20 may be an integrated circuit (IC) in which hundreds to millions or more semiconductor devices are integrated in a single chip. For example, the semiconductor chip 20 may be, but is not limited to, an application processor (AP) such as a CPU (Central Processing Unit), a GPU (Graphic Processing Unit), an FPGA (Field-Programmable Gate Array), a digital signal processor, an encryption processor, a microprocessor, and a micro controller. For example, the semiconductor chip 20 may be a logic chip such as an Analog-Digital Converter (ADC) or an Application-Specific IC (ASIC), and may be a memory chip such as a volatile memory (e.g., a DRAM) or a non-volatile memory (e.g., a ROM or a flash memory). Further, it is a matter of course that the semiconductor chip 20 may be configured by combinations thereof.

The semiconductor chip 20 may be stacked on the upper face of the substrate 10. For example, a substrate pad 14 may be formed on the upper face of the substrate 10, and a first chip pad 22 may be formed on the lower face of the semiconductor chip 20. The substrate pad 14 and the first chip pad 22 may be connected by a second bump 28. Accordingly, the substrate 10 and the semiconductor chip 20 may be electrically connected.

In some embodiments, the first stack 100 may be stacked on the semiconductor chip 20. For example, the second chip pad 24 may be formed on the upper face of the semiconductor chip 20. The second chip pad 24 and the base pad 170 may be connected by a base bump 190. Accordingly, the semiconductor chip 20 and the first stack 100 may be electrically connected.

The semiconductor package according to some embodiments further includes a third through via 25.

For example, the semiconductor chip 20 may include a fourth semiconductor substrate 21 and a wiring layer 26. The third through via 25 may penetrate the fourth semiconductor substrate 21. In some embodiments, the second chip pad 24 may come into contact with the third through via 25. For example, the second chip pad 24 may come into contact with the third through via 25 that penetrates the fourth semiconductor substrate 21 and is exposed from the upper face of the semiconductor chip 20.

Referring to FIG. 7, the semiconductor package according to some embodiments further includes an interposer 40.

The interposer 40 may be interposed between the substrate 10 and the first stack 100. For example, the interposer 40 may be stacked on the upper face of the substrate 10. For example, the first interposer pad 42 may be formed on the lower face of the interposer 40. The substrate pad 14 and the first interposer pad 42 may be connected by a third bump 48. Accordingly, the substrate 10 and the interposer 40 may be electrically connected.

In some embodiments, the first stack 100 may be stacked on the interposer 40. For example, a second interposer pad 43 may be formed on the upper face of the interposer 40. The second interposer pad 43 and the base pad 170 may be connected by a base bump 190. Accordingly, the interposer 40 and the first stack 100 may be electrically connected.

In some embodiments, the first stack 100 and the semiconductor chip 20 may be stacked side by side on the upper face of the interposer 40. The interposer 40 may facilitate the connection between the substrate 10 and the first stack 100, or the connection between the semiconductor chip 20 and the first stack 100. Further, the interposer 40 may prevent a warpage phenomenon of the semiconductor package.

In some embodiments, the interposer 40 may include a fifth semiconductor substrate 41, a second inter-wiring insulating film 44, and second wirings 46 inside the second inter-wiring insulating film 44. The second wirings 46 may be stacked from the upper face of the fifth semiconductor substrate 41. In some embodiments, a part of the second wirings 46 may connect the substrate 10 and the first stack 100, and the other part of the second wirings 46 may connect the semiconductor chip 20 and the second stack 200.

The semiconductor package according to some embodiments further includes a fourth through via 45.

The fourth through via 45 may penetrate the fifth semiconductor substrate 41. In some embodiments, the first interposer pad 42 may come into contact with the fourth through via 45. For example, the first interposer pad 42 may come into contact with the fourth through via 45 that penetrates the fifth semiconductor substrate 41 and is exposed from the lower face of the interposer 40.

Figure 9:
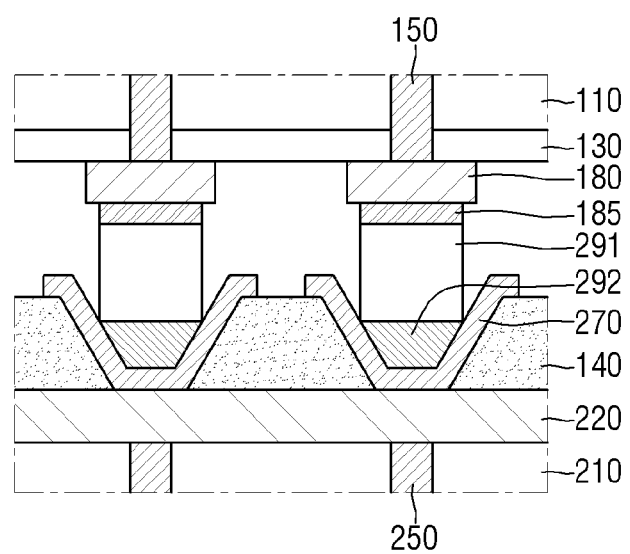
FIG. 9 is a second intermediate stage diagram for explaining the method of fabricating the semiconductor package according to the embodiment.
Figure 10:
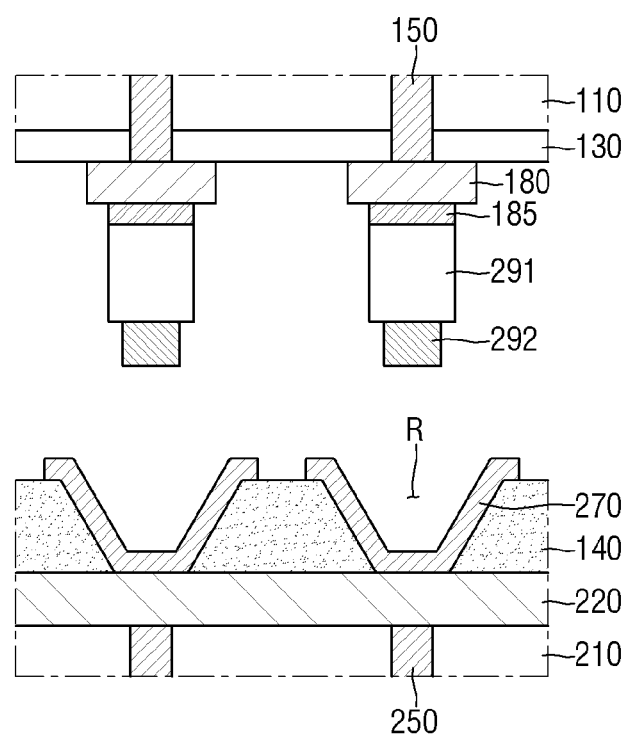
FIG. 10 is a first intermediate stage diagram for explaining a method of fabricating a semiconductor package according to an embodiment.
Figure 11:
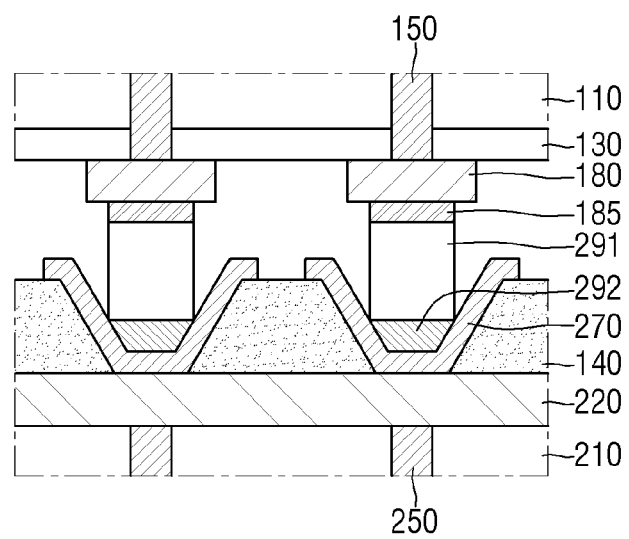
FIG. 11 is a second intermediate stage diagram for explaining the method of fabricating the semiconductor package according to the embodiment.

FIGS. 8 and 9 are intermediate stage diagrams for explaining a method of fabricating a semiconductor package according to some embodiments. FIGS. 10 and 11 are intermediate stage diagrams for explaining the method of fabricating the semiconductor package according to some embodiments.

For reference, FIGS. 8 to 11 are intermediate stage diagrams for explaining the method of fabricating the semiconductor package for bonding the first stack 100 and the second stack 200. For convenience of explanation, repeated parts of contents explained using FIGS. 1 to 7 will be simplified or omitted.

Referring to FIGS. 8 and 9, the first stack 100 may be located on the second stack 200.

The second stack 200 may include a second semiconductor substrate 210 and a second pad 270. The second pad 270 may be placed on the second semiconductor substrate 210. The second pad 270 may have a concave inner side face.

The first stack 100 may include a first semiconductor substrate 110 and a first pad 180. The first pad 180 may be placed on the first semiconductor substrate 110. The first pad 180 may have a flat shape.

The first bump 290 may be placed on the first pad 180. The first bump 290 may include a first lower bump 291 and a first upper bump 292.

A width of the first lower bump 291 may be the same as a width of the first upper bump 292.

After the first stack 100 is located on the second stack 200, the first stack 100 and the second stack 200 are bonded to each other.

At this time, the first bump 290 is inserted into an insertion recess R of the second pad 270. The first lower bump 291 comes into contact with the inner side face of the second pad 270. The first upper bump 292 may be deformed to fill the interior of the insertion recess R of the second pad 270.

Therefore, the first upper bump 292 may have a truncated cone shape. A diameter of the upper face 292U of the first upper bump 292 may be smaller than a diameter of the lower face 292L of the first upper bump 292.

The first upper bump 292 may fill at least a part of the insertion recess R. The first upper bump 292 may not be placed on the side wall 291S of the first lower bump 291.

FIGS. 10 and 11 are intermediate stage diagrams for explaining a method of fabricating a semiconductor package according to some embodiments. For reference, points different from those described using FIGS. 8 and 9 will be mainly described.

Referring to FIGS. 10 and 11, the first stack 100 may be placed on the second stack 200. After the first stack 100 is located on the second stack 200, the first stack 100 and the second stack 200 are bonded to each other.

The width of the first lower bump 291 may not be the same as the width of the first upper bump 292. For example, the width of the first lower bump 291 may be greater than the width of the first upper bump 292.

When bonding the first stack 100 and the second stack 200, the first bump 290 may be inserted into the insertion recess R of the second pad 270. The first lower bump 291 comes into contact with the inner side face of the second pad 270. The first upper bump 292 may be deformed to fill the interior of the insertion recess R of the second pad 270.

The height of the deformed first upper bump 292 may be relatively low as compared to the embodiments described using FIGS. 8 and 9. This may be the result of the width of the first upper bump 292 being reduced.

The first upper bump 292 may have a truncated cone shape. The diameter of the upper face 292U of the first upper bump 292 may be smaller than the diameter of the lower face 292L of the first upper bump 292.

FIGS. 12 to 18 are intermediate stage diagrams for explaining a method of fabricating a semiconductor package according to some embodiments. Points different from those described using FIGS. 1 to 7 will be mainly described.

Figure 12:
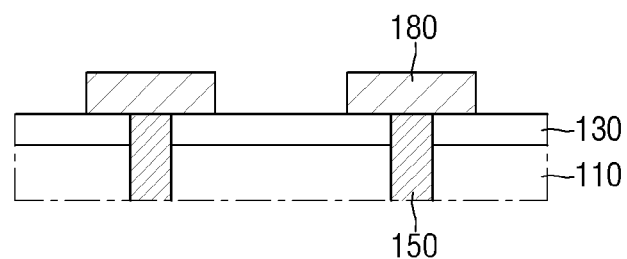
FIG. 12 is a first intermediate stage diagram for explaining a method of fabricating a semiconductor package according to an embodiment.
Figure 13:
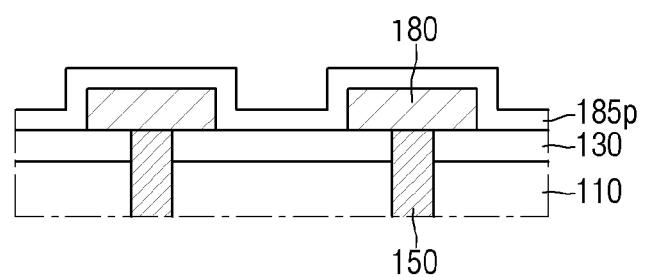
FIG. 13 is a second intermediate stage diagram for explaining the method of fabricating the semiconductor package according to the embodiment.

Referring to FIGS. 12 and 13, the first semiconductor substrate 110, the first through vias 150, and the first pad 180 may be formed.

Specifically, the first semiconductor substrate 110 may be formed.

The first protective layer 130 may be formed on the first semiconductor substrate 110. The first protective layer 130 may be formed along the upper face of the first semiconductor substrate 110.

After the first protective layer 130 is formed, the first through vias 150 that penetrate the first semiconductor substrate 110 and the first protective layer 130 may be formed. Further, a plurality of a first pad 180 which come into contact with respective ones of the first through vias 150 may be formed on the first protective layer 130.

The first pad 180 may have a shape protruding from the upper face of the first protective layer 130. However, this is merely an example, and embodiments of the present disclosure are not limited thereto.

After the first pad 180 is formed, a seed film 185*p* is formed on the first protective layer 130 and the first pad 180. The seed film 185*p* may extend along the upper face of the first protective layer 130, and the upper face and the side face of the first pad 180.

Figure 14:
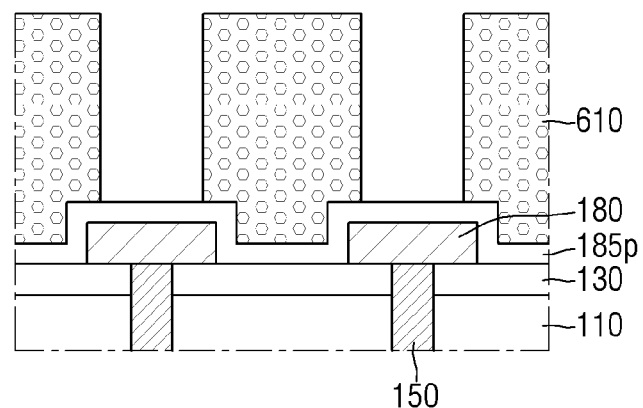
FIG. 14 is a third intermediate stage diagram for explaining the method of fabricating the semiconductor package according to the embodiment.
Figure 15:
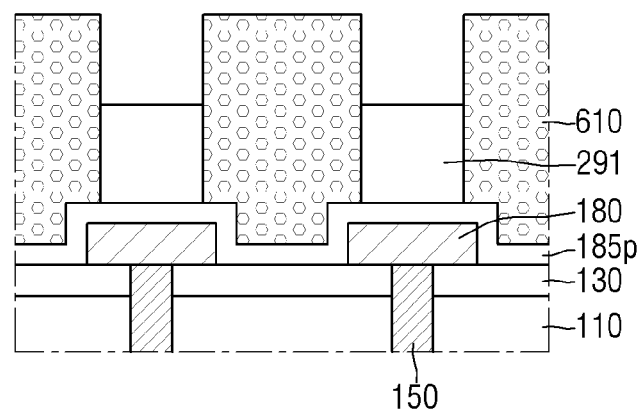
FIG. 15 is a fourth intermediate stage diagram for explaining the method of fabricating the semiconductor package according to the embodiment.
Figure 16:
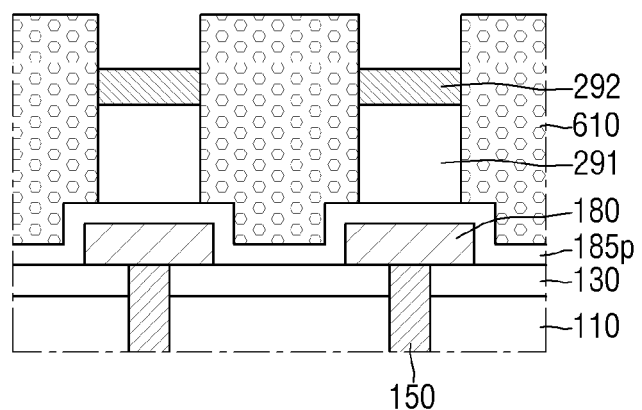
FIG. 16 is a fifth intermediate stage diagram for explaining the method of fabricating the semiconductor package according to the embodiment.

Referring to FIGS. 14 to 16, a first mask 610 may be formed on the seed film 185*p*.

The first mask 610 may expose a part of the seed film 185*p*. The first mask 610 may expose a part of the seed film 185*p* placed on the upper face of the first pad 180.

The first lower bump 291 may be formed on the seed film 185*p* exposed by the first mask 610. After that, the first upper bump 292 may be formed on the first lower bump 291 exposed by the first mask 610.

Accordingly, the first lower bump 291 and the first upper bump 292 may be sequentially stacked on the first pad 180.

Figure 17:
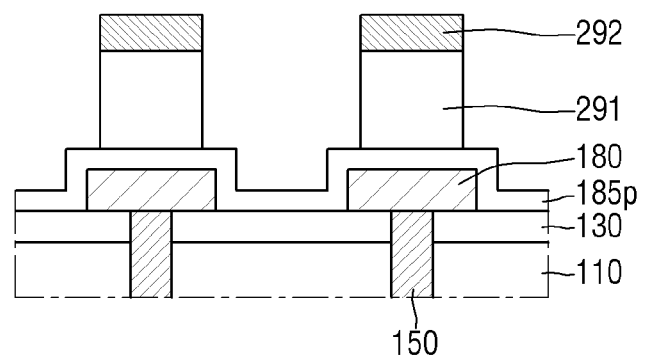
FIG. 17 is a sixth intermediate stage diagram for explaining the method of fabricating the semiconductor package according to the embodiment.
Figure 18:
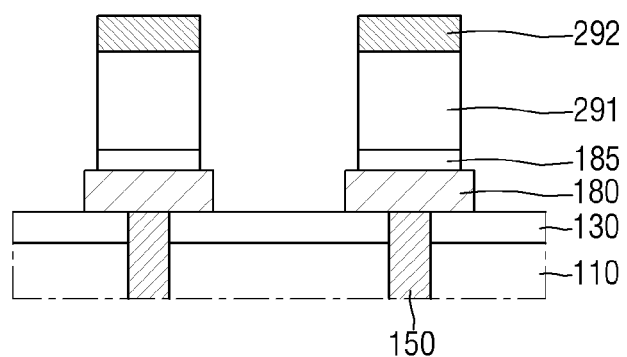
FIG. 18 is an seventh intermediate stage diagram for explaining the method of fabricating the semiconductor package according to the embodiment.
Figure 19:
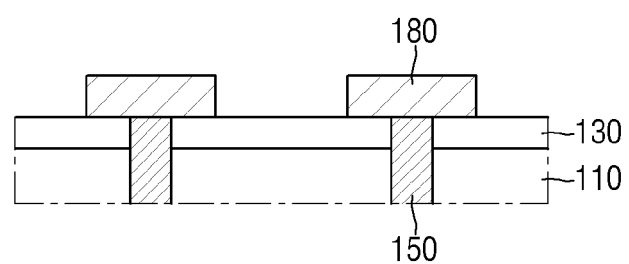
FIG. 19 is a first intermediate stage diagram for explaining a method of fabricating a semiconductor package according to an embodiment.
Figure 20:
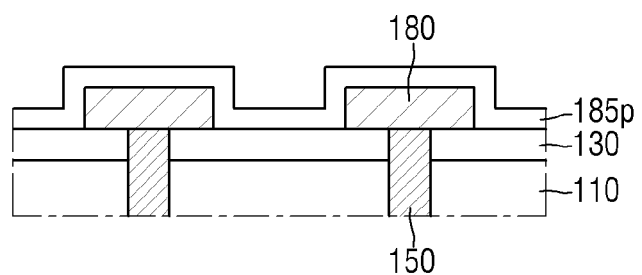
FIG. 20 is a second intermediate stage diagram for explaining the method of fabricating the semiconductor package according to the embodiment.
Figure 21:
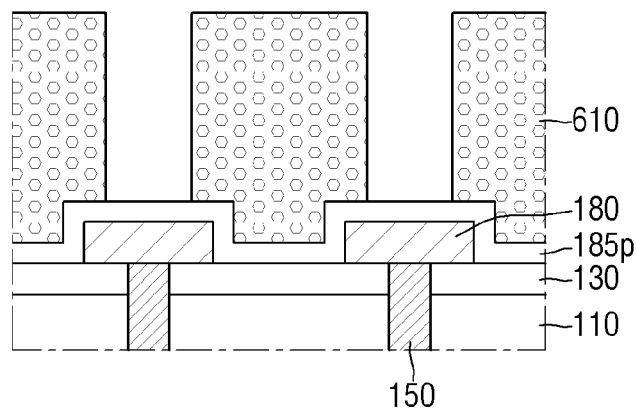
FIG. 21 is a third intermediate stage diagram for explaining the method of fabricating the semiconductor package according to the embodiment.
Figure 22:
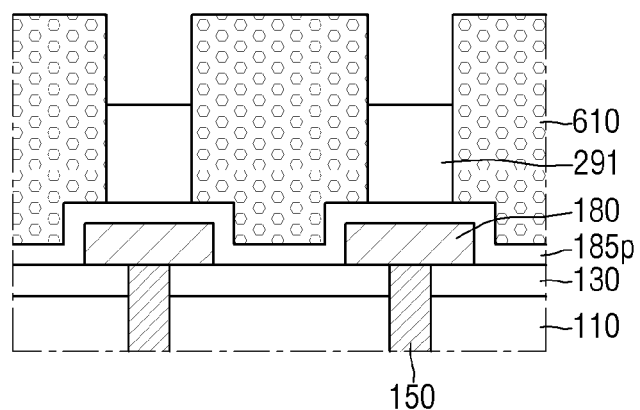
FIG. 22 is a fourth intermediate stage diagram for explaining the method of fabricating the semiconductor package according to the embodiment.

Referring to FIGS. 17 and 18, the first mask 610 may be removed.

As the first mask 610 is removed, a part of the seed film 185*p* may be exposed.

A part of the exposed seed film 185*p* may be removed. The other part of the seed film 185*p* placed between the first pad 180 and the first lower bump 291 may not be removed.

Accordingly, the seed layer 185 may be formed. The seed layer 185 may be placed between the first pad 180 and the first lower bump 291.

FIGS. 19 to 27 are intermediate stage diagrams for explaining a method of fabricating a semiconductor package according to some embodiments. For convenience of explanation, points different from those described using FIGS. 12 to 18 will be mainly described.

For reference, the intermediate stages of FIGS. 19 to 22 are the same as those of the intermediate stages of FIGS. 12 to 15, and explanation thereof will be simplified.

The first semiconductor substrate 110, the first through vias 150, and the first pad 180 may be formed. After the first pad 180 is formed, a seed film 185*p* may be formed on the first protective layer 130 and the first pad 180. The first mask 610 may be formed on the seed film 185*p*.

The first mask 610 may expose a part of the seed film 185*p*. The first mask 610 may expose a part of the seed film 185*p* placed on the upper face of the first pad 180. The first lower bump 291 may be formed on the seed film 185*p* exposed by the first mask 610.

Figure 23:
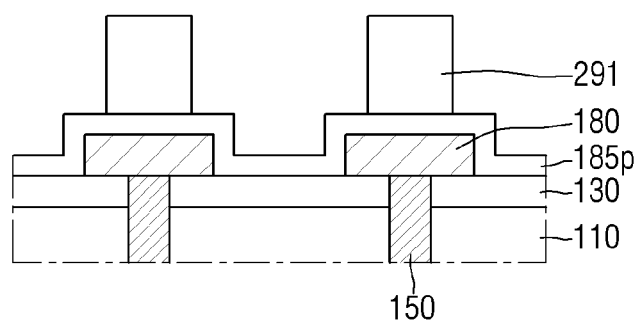
FIG. 23 is a fifth intermediate stage diagram for explaining the method of fabricating the semiconductor package according to the embodiment.

Referring to FIG. 23, the first mask 610 may be removed.

Figure 24:
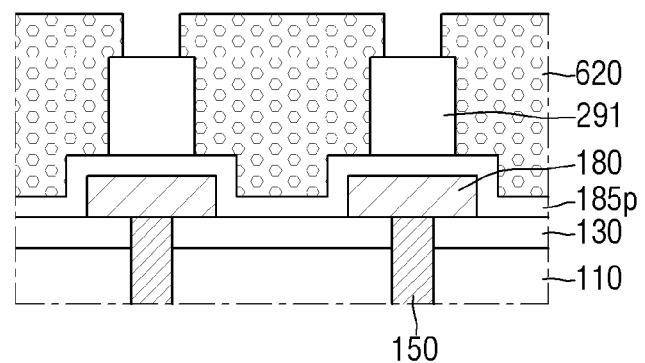
FIG. 24 is a sixth intermediate stage diagram for explaining the method of fabricating the semiconductor package according to the embodiment.
Figure 25:
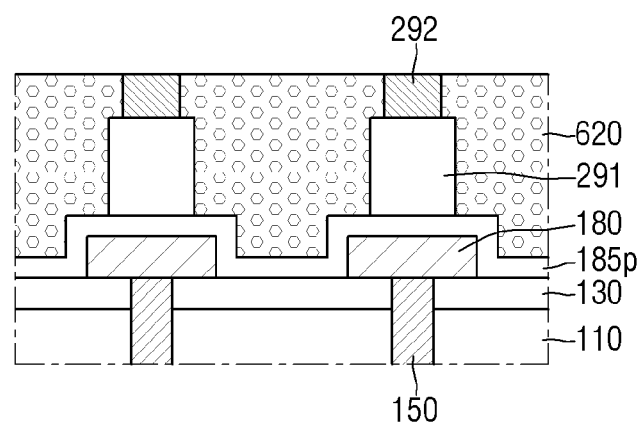
FIG. 25 is an seventh intermediate stage diagram for explaining the method of fabricating the semiconductor package according to the embodiment.

Referring to FIGS. 24 and 25, a second mask 620 may be formed. The second mask 620 may be formed on the seed film 185*p* and the first lower bump 291.

The second mask 620 may expose a part of the upper face of the first lower bump 291. The first upper bump 292 may be formed on a part of the upper face of the exposed first lower bump 291.

Therefore, the width of the first upper bump 292 may be smaller than the width of the first lower bump 291.

Figure 26:
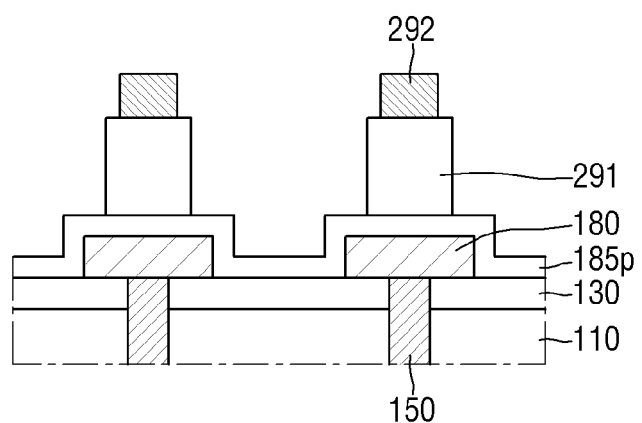
FIG. 26 is an eighth intermediate stage diagram for explaining the method of fabricating the semiconductor package according to the embodiment.
Figure 27:
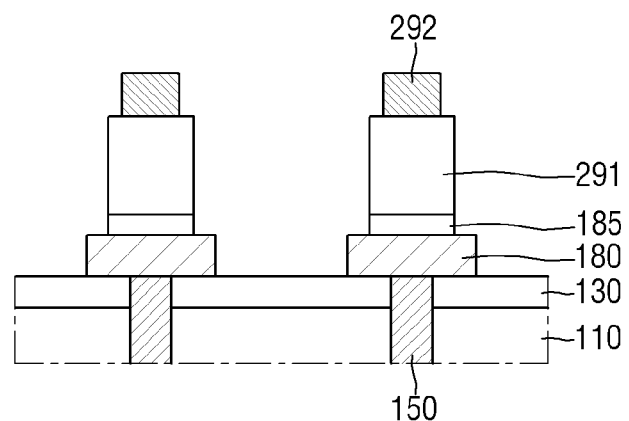
FIG. 27 is a ninth intermediate stage diagram for explaining the method of fabricating the semiconductor package according to the embodiment.

Referring to FIGS. 26 and 27, the second mask 620 may be removed.

As the second mask 620 is removed, a part of the seed film 185*p* may be exposed.

A part of the exposed seed film 185*p* may be removed. The other part of the seed film 185*p* placed between the first pad 180 and the first lower bump 291 may not be removed.

Accordingly, the seed layer 185 may be formed. The seed layer 185 may be placed between the first pad 180 and the first lower bump 291.

In concluding the detailed description, those skilled in the art will appreciate that many variations and modifications may be made to the non-limiting example embodiments without departing from the principles of the disclosure. Therefore, the described embodiments of the disclosure are used in a generic and descriptive sense only and not for purposes of limitation.

What is claimed is:

1. A semiconductor package comprising:
   a first stack comprising a first semiconductor substrate;
   a through via that penetrates the first semiconductor substrate in a first direction;
   a second stack that comprises a second face facing a first face of the first stack, on the first stack;
   a first pad that is in contact with the through via, on the first face of the first stack;
   a second pad comprising a concave inner side face that defines an insertion recess, the second pad located on the second face of the second stack; and
   a bump that connects the first pad and the second pad,
   wherein the bump comprises a first upper bump on the first pad, and a first lower bump between the first upper bump and the first pad,
   wherein the first upper bump comprises a material different from a material of the first lower bump, and
   wherein the first upper bump fills at least a part of the insertion recess and is not located on a side wall of the first lower bump.

2. The semiconductor package of claim 1, wherein the first upper bump does not include tin (Sn).

3. The semiconductor package of claim 2, wherein the first upper bump comprises a metal having a melting point of 400 degrees or higher.

4. The semiconductor package of claim 2, wherein the first upper bump comprises at least one from among Zn, Al, Au, and Ag.

5. The semiconductor package of claim 2, wherein the first lower bump and the second pad comprise a same material, and
   the first lower bump comprises copper.

6. The semiconductor package of claim 1, wherein a depth of the second pad in the first direction is smaller than a height of the bump in the first direction.

7. The semiconductor package of claim 1, further comprising:
   an additional through via that penetrates the first semiconductor substrate in the first direction;
   an additional first pad that is in contact with the additional through via, on the first face of the first stack;
   an additional second pad comprising a concave inner side face that defines an insertion recess, the additional second pad located on the second face of the second stack; and
   an additional bump that connects the additional first pad and the additional second pad,
   wherein the additional bump comprises a second lower bump spaced apart from the first lower bump in a second direction intersecting the first direction, and a second upper bump formed on the second lower bump, and
   wherein a length from a center of the first lower bump to a center of the second lower bump along the second direction is smaller than 20 m.

8. The semiconductor package of claim 1, further comprising:
   a seed layer between the first pad and the bump,
   wherein the bump is provided along an upper face of the seed layer.

9. The semiconductor package of claim 8, wherein the seed layer comprises a first seed layer and a second seed layer which are sequentially stacked on the first pad,
   the first seed layer comprises Ti, and
   the second seed layer comprises Cu.

10. The semiconductor package of claim 1, wherein an inner side face of the second pad comprises an upper face that faces in a same direction as a facing direction of the second face of the second stack, and the inner side face further comprises a first side wall and a second side wall that face each other, and
    the first side wall of the inner side face and the second side wall of the inner side face extend in the first direction.

11. The semiconductor package of claim 10, wherein the first side wall of the inner side face and the second side wall of the inner side face are perpendicular to the upper face of the inner side face.

12. The semiconductor package of claim 10, wherein the first upper bump comprises an upper face and a lower face that are opposite to each other,
    the upper face is in contact with the second pad,
    the lower face is in contact with the first lower bump, and
    a diameter of the upper face of the first upper bump is smaller than a diameter of the lower face of the first upper bump.

13. The semiconductor package of claim 10, wherein the first lower bump is in contact with the first side wall and the second side wall of the inner side face of the second pad.

14. A semiconductor package comprising:
    a first semiconductor chip comprising a first semiconductor substrate, and a first semiconductor device layer on a lower face of the first semiconductor substrate;
    a second semiconductor chip comprising a second semiconductor substrate, and a second semiconductor device layer on a lower face of the second semiconductor substrate, the second semiconductor chip located on the first semiconductor chip;
    a first through via that penetrates the first semiconductor substrate in a first direction;
    a first pad that is in contact with the first through via, on an upper face of the first semiconductor substrate;
    a second pad that comprises an inner side face that is concave and defines an insertion recess, the second pad located on the lower face of the second semiconductor device layer; and
    a bump that connects the first pad and the second pad,
    wherein the bump comprises an upper bump on the first pad, and a lower bump between the upper bump and the first pad,
    wherein the upper bump comprises a material different from a material of the lower bump, and
    wherein the upper bump fills at least a part of the insertion recess and is not located on a side wall of the lower bump.

15. The semiconductor package of claim 14, wherein the upper bump does not include tin (Sn).

16. The semiconductor package of claim 15, wherein the upper bump comprises at least one from among Zn, Al, Au, and Ag.

17. The semiconductor package of claim 14, wherein a depth of the second pad in the first direction is smaller than a height of the bump in the first direction.

18. The semiconductor package of claim 14, wherein the inner side face of the second pad comprises an upper face that faces in a same direction as a facing direction of the lower face of the second semiconductor device layer, and the inner side face further comprises a first side wall and a second side wall facing each other, and
the first side wall of the inner side face and the second side wall of the inner side face extend in the first direction.

19. The semiconductor package of claim 18, wherein the first side wall of the inner side face and the second side wall of the inner side face are perpendicular to the upper face of the inner side face.

20. A semiconductor package comprising:
a first stack comprising a first semiconductor substrate;
a through via that penetrates the first semiconductor substrate in a first direction;
a second stack that comprises a second face facing a first face of the first stack, on the first stack;
a first pad that is in contact with the through via, on the first face of the first stack;
a second pad comprising a concave inner side face that defines an insertion recess, the second pad located on the second face of the second stack;
a bump that connects the first pad and the second pad; and
a seed layer between the first pad and the bump,
wherein the bump comprises a first upper bump on the first pad, and a first lower bump between the first upper bump and the first pad, and is placed along an upper face of the seed layer,
wherein the seed layer comprises a first seed layer between the first pad and the first upper bump, and a second seed layer between the first seed layer and the first upper bump,
wherein the first seed layer comprises titanium,
wherein the second seed layer comprises copper,
wherein the first pad comprises at least one from among aluminum and copper,
wherein the second pad comprises copper,
wherein the first upper bump does not include tin, and comprises at least one from among zinc, aluminum, gold and silver,
wherein the first lower bump comprises copper,
wherein an inner side face of the second pad comprises an upper face that that faces in a same direction as a facing direction of the second face of the second stack, and the inner side face further comprises a first side wall and a second side wall that face each other, the first side wall of the inner side face and the second side wall of the inner side face extending in the first direction,
wherein a depth of the second pad in the first direction is smaller than a height of the bump in the first direction, and
wherein the first upper bump fills at least a part of the insertion recess, and is not located on a side wall of the first lower bump.

\* \* \* \* \*